(12) United States Patent
Nishi et al.

(10) Patent No.: US 6,302,769 B1
(45) Date of Patent: Oct. 16, 2001

(54) METHOD FOR CHAMFERING A WAFER

(75) Inventors: Kenichiro Nishi, Kanagawa; Shirou Murai, Toyama, both of (JP)

(73) Assignee: Nippei Toyama Corporation, Tokyo (JP)

( * ) Notice: Subject to any disclaimer, the term of this patent is extended or adjusted under 35 U.S.C. 154(b) by 0 days.

(21) Appl. No.: 09/290,176

(22) Filed: Apr. 13, 1999

(30) Foreign Application Priority Data

Apr. 13, 1998 (JP) .................................................. 10-101267
Feb. 26, 1999 (JP) .................................................. 11-050348

(51) Int. Cl.$^7$ ....................................................... B24B 1/00
(52) U.S. Cl. .............................. 451/44; 451/43; 451/63; 451/211; 451/218
(58) Field of Search ............................. 451/44, 43, 211, 451/218, 246, 21, 63

(56) References Cited

U.S. PATENT DOCUMENTS

| 5,445,554 | * | 8/1995 | Hosokawa ............................. | 451/44 |
| 5,458,529 | * | 10/1995 | Hasegawa et al. .................... | 451/44 |
| 5,490,811 | * | 2/1996 | Hosokawa ............................. | 451/44 |
| 5,514,025 | * | 5/1996 | Hasegawa et al. .................... | 451/44 |
| 5,658,189 | * | 8/1997 | Kagamida .............................. | 451/44 |
| 5,727,990 | * | 3/1998 | Hasegawa et al. .................... | 451/44 |
| 5,971,836 | * | 10/1999 | Kogure et al. ......................... | 451/41 |

FOREIGN PATENT DOCUMENTS

| 2-87523 | 3/1990 | (JP) . |
| 4-364729 | 12/1992 | (JP) . |
| 8-241879 | 9/1996 | (JP) . |
| 9-168953 | 6/1997 | (JP) . |

\* cited by examiner

*Primary Examiner*—Joseph J. Hail, III
*Assistant Examiner*—G Nguyen
(74) *Attorney, Agent, or Firm*—Sughrue, Mion, Zinn, Macpeak & Seas, PLLC

(57) ABSTRACT

In the wafer chamfering method, there is used a disk-shaped grindstone 8 which includes: a peripheral edge portion serving as a grinding surface 1; a flat portion formed in the central portion of the grinding surface 1 in the width direction thereof; and, two edge portions 5 respectively formed on the two sides of the flat portion 2 in the width direction thereof and made in the form of the shape of the valley portion of the notch portion 4 of a disk-shaped wafer 3 to be chamfered. In operation, in the wafer chamfering method, while rotating the above grindstone 8, the grindstone 8 is revolved in the thickness direction of the wafer 3 to thereby chamfer the wafer 3. Especially, the present wafer chamfering method comprises two steps: that is, a circumferential portion grinding step in which the grindstone is supported such that it stands upright or at right angles to the circumferential portion 6 of the wafer 3 at their respective mutual contact points and only the flat portion of the grindstone 8 is contacted with the mutual contact points to thereby chamfer the peripheral edge portion of the wafer 3; and, a notch portion grinding step in which the grindstone is supported such that it is inclined with respect to the diameter direction of the notch portion of the wafer 3 by an angle of about 45° in the circumferential direction of the wafer 3 and the edge portions 5 or both of the edge portions 5 and flat portion 2 are used to chamfer the notch portion 4 of the wafer 3.

31 Claims, 11 Drawing Sheets

METHOD FOR CHAMFERING A WAFER

BACKGROUND OF THE INVENTION

The present invention relates to a wafer chamfering method for working the peripheral edge portion of a semiconductor wafer, particularly, relates to a wafer chamfering method for working the peripheral edge portion of a semiconductor wafer into a convexly curved surface shape using a disk-shaped grindstone.

Conventionally, in a process for manufacturing a semiconductor device, in order to be able to facilitate the matching of the crystal orientation of a semiconductor wafer, in the peripheral edge of the wafer, there is formed an orientation flat which can be produced by cutting linearly part of the peripheral edge of the wafer, or a notch portion which can be produced by cutting part of the peripheral edge of the wafer in a substantially V-like or arc-like shape. Especially, the substantially V-shaped notch portion is most often employed because the V-shaped notch portion makes it possible to make efficient use of the limited area of the wafer and also can provide excellent positioning precision.

In the conventional semiconductor device manufacturing process, not infrequently, the peripheral edge of the semiconductor wafer is accidentally contacted with part of a device which is used in the semiconductor device manufacturing process. Such contact sometimes produces fragments or tips which are causes to deteriorate the quality of the semiconductor device. Therefore, it is necessary to chamfer the peripheral edge of the semiconductor wafer and, today, a wafer chamfering operation is generally employed in the semiconductor device manufacturing process.

Conventionally, to form a curved surface in the peripheral edge portion of a wafer, the rotational axis of a grindstone is moved in the thickness direction of the wafer along an orbit selected in consideration of the shape of the wafer peripheral edge portion after chamfered, such as a circular orbit around the peripheral edge portion of the wafer. And, in this operation, the grindstone is solely contacted with the peripheral edge of the wafer in such a manner as shown in FIG. 13, that is, the grindstone is supported such that it stands up straight or at right angles to the peripheral edge portion of the wafer at their mutual contact points, while the grinding surface of the grindstone is formed relatively sharp in order to be able to grind the notch portion of the wafer which is small in area. Therefore, it is inevitable that, in use, the sharp or tapered grinding surface of the grindstone can be worn or abraded and thus flattened in a short period of time.

Also, since, in the notch portion, the thickness of the grindstone is limited so as to be able to provide the sharp portion thereof as large as possible, from the viewpoint of strength, only the grindstone having a small diameter (that is, having a small circumference) can be used. Further, such small-diameter grindstone is not able to enhance the working efficiency thereof unless it is rotated at a very high speed, but such high-speed rotation of the grindstone causes the grinding surface of the grindstone to lose its predetermined allowable shape early. This is a vicious circle. If the grinding surface of the grindstone loses its predetermined allowable shape, then the shape of the working surface of the wafer is influenced by the thus shape-lost or deformed grinding surface. This raises the need to dress/adjust the deformed grinding surface again, which in turn increases the cost of the wafer as well as the cycle time of the wafer (that is, a unit time necessary to chamfer the peripheral edge portion of a piece of wafer). Similarly, from the viewpoint of preventing the grinding surface from losing its predetermined allowable shape, in the conventional wafer chamfering method, it is difficult that the same grindstone is commonly used to chamfer the circumferential portion of the wafer as well as to chamfer the notch portion thereof which is sharpened: that is, a series of chamfering operations to be executed continuously without replacing the grindstone cannot be applied in both of the circumferential portion and notch portion of the wafer.

Further, conventionally, a so called forming grindstone (a grindstone having a section which corresponds in shape to the shape of a workpiece or a wafer to be chamfered) is used in the mirror-surface working operation on the circumferential portion of a wafer, and the forming grindstone is rotated at a high speed of several thousands m/min. to thereby grind the circumferential portion of the wafer into a mirror-like surface. However, to provide such mirror-like surface, it is necessary to use a relatively soft grindstone having a micro abrasive grains. Therefore, the grindstone itself can be easily abraded partially to thereby lose its shape, and the shape loss of the grindstone is transferred to the wafer to thereby roughen the surface of the wafer. To avoid this, the grindstone must undergo a re-shaping/dressing operation frequently, which increases the cost of the wafer chamfering method.

Still further, in the conventional wafer chamfering method, because the relation between the peripheral speed of a wafer (that is, the moving speed of the peripheral edge of the wafer obtained as the wafer is rotated) and the peripheral speed of a grindstone (that is, the moving speed of the peripheral edge of the grindstone obtained as the grindstone is rotated) is not decided, grinding streaks are often produced in such a manner as to cause cracks in the wafer easily; and, in particular, when the peripheral speed of a wafer is low, the wafer is damaged extremely heavily when it is contacted with the grindstone.

Further, there is enforced a conventional method which uses float grains (so called as slurry) to polish the wafer. With use of this method, although the polished condition of the top surface portion of the wafer surface can be enhanced, the surface of the wafer cannot be finished in an arbitrary shape nor in the same shape all the time due to the fact that the polishing is depended upon the float grains being uncontrollable (see Japanese Patent Unexamined Publication No. Hei. 9-168953).

SUMMARY OF THE INVENTION

The present invention aims at eliminating the drawbacks found in the above-mentioned conventional wafer chamfering method.

Accordingly, it is an object of the present invention to provide a wafer chamfering method which can chamfer a surface of wafer into an arbitrary shape and in the same shape all the time with excellent reproduction characteristics. In the above-mentioned object can be attained by a wafer chamfering method, according to the present invention, comprising the steps of:

chamfering a peripheral edge portion of a disk-shaped wafer while rotating a disk-shaped grinding wheel and revolving around the peripheral edge portion of the disk-shaped wafer in a width direction thereof under conditions that a first plane substantially containing the disk-shaped wafer is substantially extended perpendicular to a second plane substantially containing the disk-shaped grinding wheel and that the second plane is substantially contained in a third plane which is defined by containing a diameter of the wafer and substantially extending perpendicular to the first plane.

In addition, it is also an object of the invention to provide a wafer chamfering method which can commonly use the same grindstone in both grinding the circumferential portion of a wafer and in chamfering the tapered notch portion of the wafer to thereby be able not only to carry out a series of chamfering operations without replacing the grindstone but also to use the same grindstone for a relatively long period of time.

In the above-mentioned object can be attained by a wafer chamfering method, according to the present invention, comprising the steps of:

chamfering a peripheral edge portion of a disk-shaped wafer while rotating a disk-shaped grinding wheel and revolving around the peripheral edge circumferential portion of the disk-shaped wafer in a width direction thereof under conditions that a first plane substantially containing the disk-shaped wafer is substantially extended perpendicular to a second plane substantially containing the disk-shaped grinding wheel and that the second plane is substantially contained in a third plane which is defined by containing a diameter of the wafer and substantially extending perpendicular to the first plane; and forming a notch portion on the disk-shaped wafer while rotating the grind wheel under conditions that the first plane is substantially extended perpendicular to the second plane and that the second plane is inclined with respect to the third plane by an predetermined angle.

In the above-mentioned wafer chamfering method, according to the present invention, it is advantageous that the second plane is inclined with respect to the third plane by an angle of about 45° when the notch portion is formed.

In the above-mentioned wafer chamfering method, according to the present invention, it is also advantageous that the disk-shaped grinding wheel comprises:

a first disk-shaped grindstone member having a flat portion for chamfering the circumferential portion; and a second disk-shaped grindstone member attached to the first disk-shaped grindstone member and having an edge portion in the form of a shape mating with a part of the notch so as to form a valley part of the notch portion.

In addition, the above objects can also be achieved by a wafer chamfering method according to the present invention, wherein a disk-shaped grindstone is revolved, while rotating the grindstone, in the width direction of a disk-shaped wafer to be chamfered while the wafer is supported in a rotating manner, thereby chamfering the wafer, the grindstone including a peripheral edge portion serving as a grinding surface, a flat portion formed in the central portion of the grinding surface in the width direction thereof, and two edge portions respectively formed on the two sides of the flat portion in the width direction thereof and made in the form of the shape of the valley portion of a notch portion of the wafer, the present wafer chamfering method comprising the two following steps: that is, a circumferential portion grinding step in which the grindstone is so supported as to stand upright or at right angles to a circumferential portion of the wafer at their respective mutual contact points and only the flat portion of said grindstone is contacted with the mutual contact points to thereby chamfer the circumferential portion of the wafer; and, a notch portion grinding step in which the grindstone is so supported as to be inclined with respect to the diameter direction of the notch portion of the wafer by an angle of about 45° in the circumferential direction of the wafer, and the edge portions or both of the edge portions and flat portion are used to chamfer the notch portion of the wafer.

In the above-mentioned structure, "to use the peripheral edge portion of the grindstone as the grinding surface" means that the peripheral edge portion of the grindstone (including the peripheral edge portions of the two end faces of the grindstone and the peripheral surface of the grindstone) is used in a wafer chamfering operation. However, it does not mean that only the peripheral edge portion of the grindstone has abrasive grains. Therefore, it is naturally possible that almost the whole of the grindstone is made of abrasive grains. Preferably, the flat portion of the grinding surface may be formed sufficiently wider than the contact width of the flat portion with respect to the peripheral edge portion of the wafer to thereby make it difficult for the abrasion of the flat portion to have ill influences on the above-mentioned edge portions of the grindstone. Also, the edge portions may be molded in a curved surface shape according to the valley portion shape of the notch portion of the wafer. Further, "to rotate the grindstone in the thickness direction of the wafer" means, for example, that the rotational axis of the grindstone is arranged in parallel to the plane (surface) of the wafer.

The circumferential portion of the wafer means the circumferential-shaped portion of the peripheral edge portion of the wafer, that is, the other remaining portions of the peripheral edge portion of the wafer than the notch portion thereof. "To support the grindstone upright or at right angles to the circumferential portion of the wafer at the respective mutual contact points" means that not only the rotational axis of the grindstone is arranged in parallel to the plane (surface) of the wafer, but also the supporting direction of the grindstone is coincident with the diameter direction of the wafer at the mutual contact points between the grindstone and wafer. "To chamfer the notch portion of the wafer using the edge portions or both of the edge portions and flat portion of the grindstone" does not mean that the notch portion is chamfered using only the edge portions and flat portion of the grindstone, but it also includes a case in which the adjoining portions of the edge portions and flat portion are used in such wafer chamfering operation.

Further, the above objects can also be achieved by a wafer chamfering method according to the present invention, wherein a grindstone, while rotating the grindstone, is revolved in the thickness direction of a wafer supported in a rotating manner to thereby chamfer the wafer, the wafer chamfering method comprising the two following steps: that is, a circumferential portion grinding step in which, as the grindstone, there is used a disk-shaped grindstone including a peripheral edge portion serving as a grinding surface and at least a flat portion in the width direction of the grinding surface is used, and the flat portion of the grindstone is so supported as to stand upright or at right angles to a circumferential portion of wafer at their respective mutual contact points to thereby chamfer the circumferential portion of the wafer; and, a notch portion grinding step in which, as a grindstone, a grindstone including a flat portion and at least one edge portion is used to chamfer a notch portion of the wafer, or a grindstone including only the edge portion and a grindstone including only the flat portion are used in combination to chamfer the notch portion of the wafer.

DETAILED DESCRIPTION OF THE PREFERRED EMBODIMENTS

Now, description will be given below of an embodiment of a wafer chamfering method according to the invention, in which a wafer is chamfered by a circumferential portion grinding step and a notch portion grinding step in this order.

Figure 4:
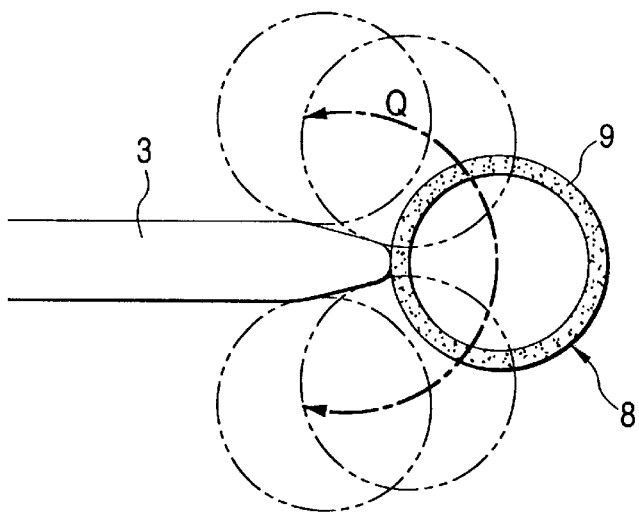
FIG. 4 is an explanatory view of an embodiment of the orbit of a grindstone employed in a wafer chamfering method according to the invention.
Figure 5A:
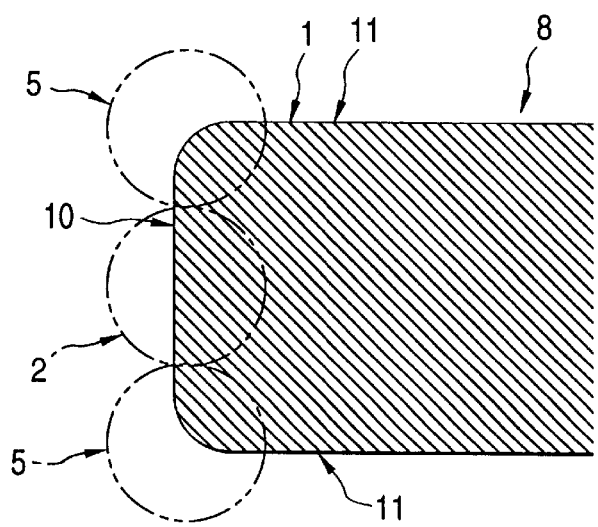
FIG. 5A is an enlarged view of an embodiment of the grinding surface of a grindstone employed in a wafer chamfering method according to the invention.

A grindstone 8, which is used to chamfer a wafer 3, has such a disk shape as shown in FIG. 4 and includes a grindstone main body 9 which is formed by securing abrasive grains fixedly to the peripheral edge portion of the grindstone 8. The surface of the grindstone main body 9 is used as a grinding surface 1: in particular, in the grinding surface 1, in the width-direction central portion of the peripheral surface 10 of the grindstone 8, there is formed a flat portion 2 and, at the positions of the grinding surface 1 that are respectively located in the neighborhood of the boundary between the peripheral surface 10 of the grindstone 8 and the end faces 11 thereof and correspond to the width-direction two sides of the flat portion 2, there are formed two edge portions 5 which are respectively made in the shape of the valley portion shape of the notch portion 4 of the wafer 3 to be chamfered (see FIG. 5A). By the way, as the grindstone 8, it is preferred to use a grindstone which has a diameter in the range of 50–200 mm.

The grindstone 8 is disposed in such a manner that its rotational axis P intersects at right angles to the center axis O of the wafer 3 (that is, the rotation axis P extends in parallel to the plane of the wafer 3), and thus, in operation, the grinding surface 1 of the grindstone 8 is able to grind the peripheral edge portion of the wafer 3 while moving in the thickness direction of the wafer 3 (that is, while the grindstone 8 is rotating about the rotational axis P in the thickness direction of the wafer 3). Referring in particular to an operation to chamfer the peripheral edge portion of the wafer 3, the diameter of the grindstone 8 and a curvingly-shaped orbit Q for the movement of the rotational axis P of the grindstone 8 are respectively set so as to correspond to the section shape of the peripheral edge portion of the wafer 3 after chamfered, and the rotational axis P of the grindstone 8 is moved in the thickness direction of the wafer 3 along the orbit Q (see FIG. 4) in every portion of the peripheral edge portion of the wafer 3, thereby chamfering the peripheral edge portion of the wafer 3 in a curved manner. And, in the present embodiment, a support base (not shown) is rotated through a rotary shaft secured to a given position, and the disk-shaped wafer 3, which is fixedly secured on the support base and has an almost circular shape, is rotated to thereby chamfer the wafer 3 over the whole peripheral edge portion thereof.

Figure 10A:
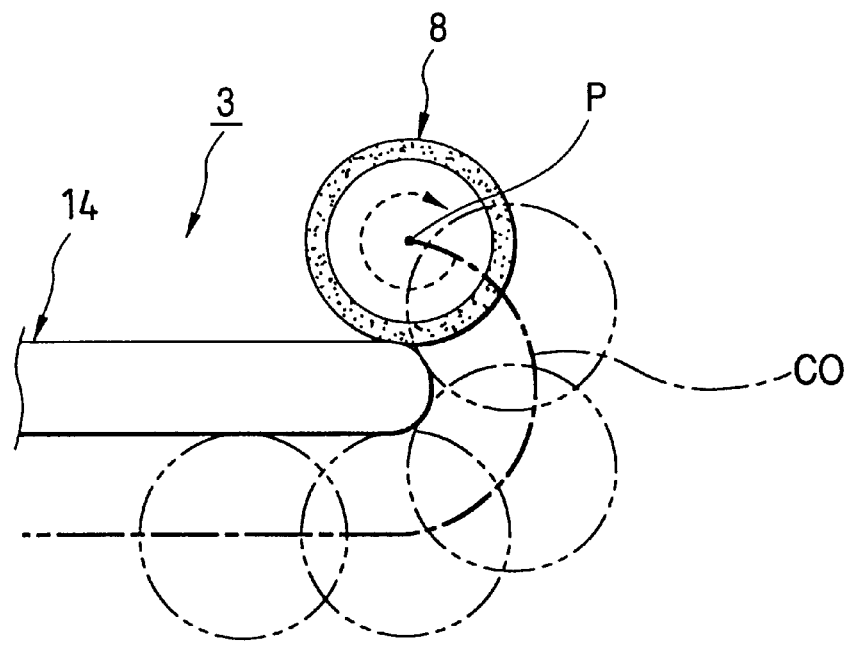
FIG. 10A is an explanatory view of an another embodiment of the orbit of a grindstone employed in a wafer chamfering method according to the invention.
Figure 10B:
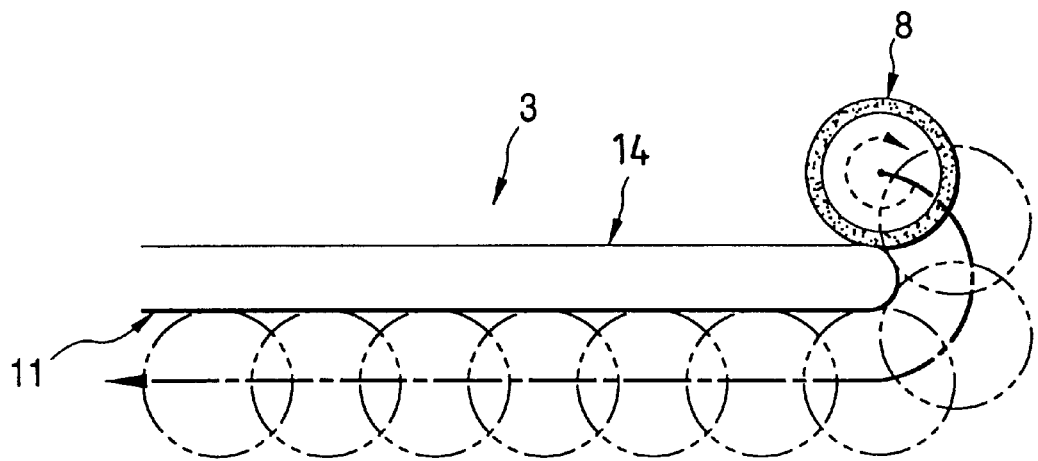
FIG. 10B is an explanatory view of an embodiment of the movement of a grindstone employed in a wafer chamfering method according to the invention.

In another embodiment, as shown in FIG. 10A, that is, in a case in which the peripheral edge portion of the wafer 3 is chamfered in a circumferential shape, the diameter of the grindstone 8 and the rotational axis P of the grindstone 8 are respectively set so as to correspond to the curvature of the wafer peripheral edge portion after chamfered, and the rotational axis P of the grindstone 8 is moved in the thickness direction of the wafer 3 in every portion of the peripheral edge portion of the wafer 3 along a circular orbit CO having its center at a position which can be obtained by the thus set grindstone 8 diameter and the moving radius of the rotational axis P, thereby being able to chamfer the peripheral edge portion of the wafer 3 in a circumstantial shape. And, as shown further in FIG. 10B, if the grindstone 8 is moved linearly along the end face 14 of the wafer 3, then the peripheral edge portion and end face 14 of the wafer 3 can be ground into a mirror-like surface in the same step, which in turn can enhance the efficiency of the grinding operation as well.

Figure 1:
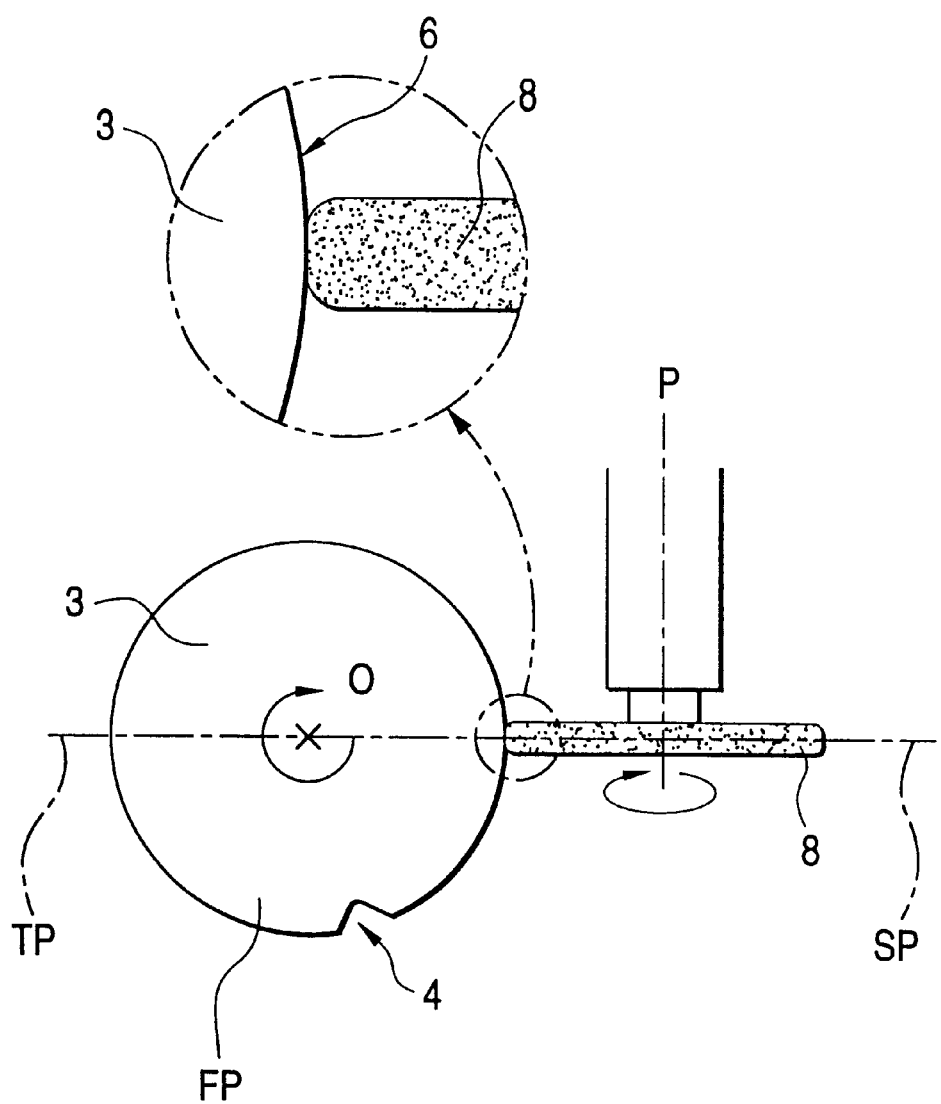
FIG. 1 is an explanatory view of an embodiment of a circumferential portion grinding step employed in a wafer chamfering method according to the invention.
Figure 3:
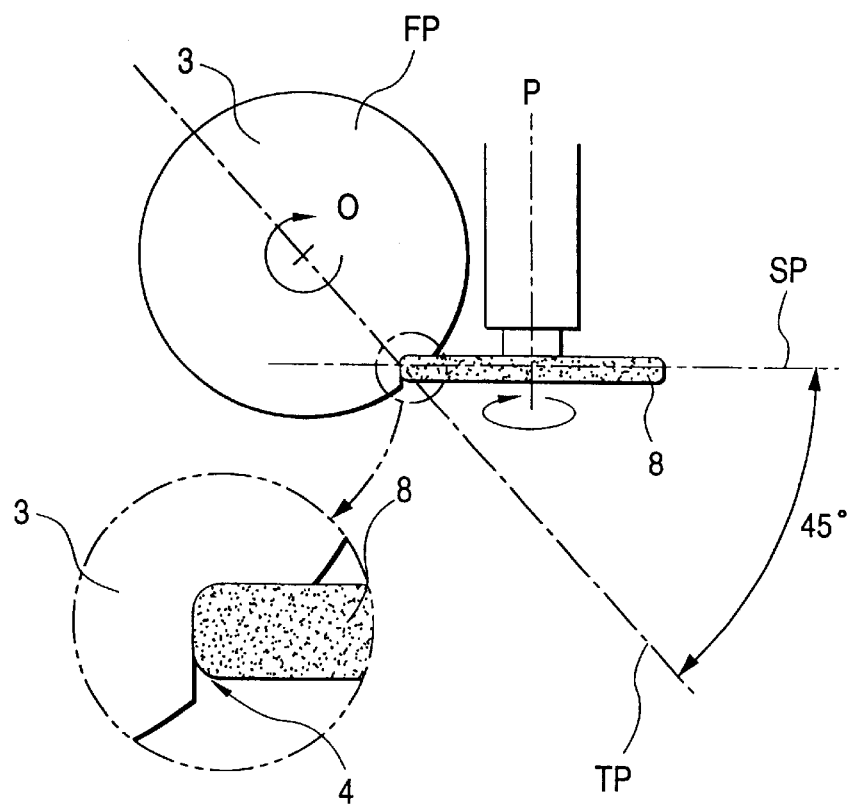
FIG. 3 is an explanatory view of an embodiment of a notch portion grinding step employed in a wafer chamfering method according to the invention.

In other words, in the wafer chamfering method according to the present invention, a circumferential portion 6 of a disk-shaped wafer 3 is chamfered while rotating a disk-shaped grinding wheel 8 and revolving around the circumferential portion 6 of the disk-shaped wafer 3 in a width direction thereof under following conditions (i) and (ii):

(i) a first plane FP substantially containing the disk-shaped wafer 3 is substantially extended perpendicular to a second plane SP substantially containing the disk-shaped grinding wheel 8; and (ii) that the second plane SP is substantially contained in a third plane TP which is defined by containing a diameter of the wafer and substantially extending perpendicular to the first plane FP (Refer FIGS. 1 and 3).

Figure 6:
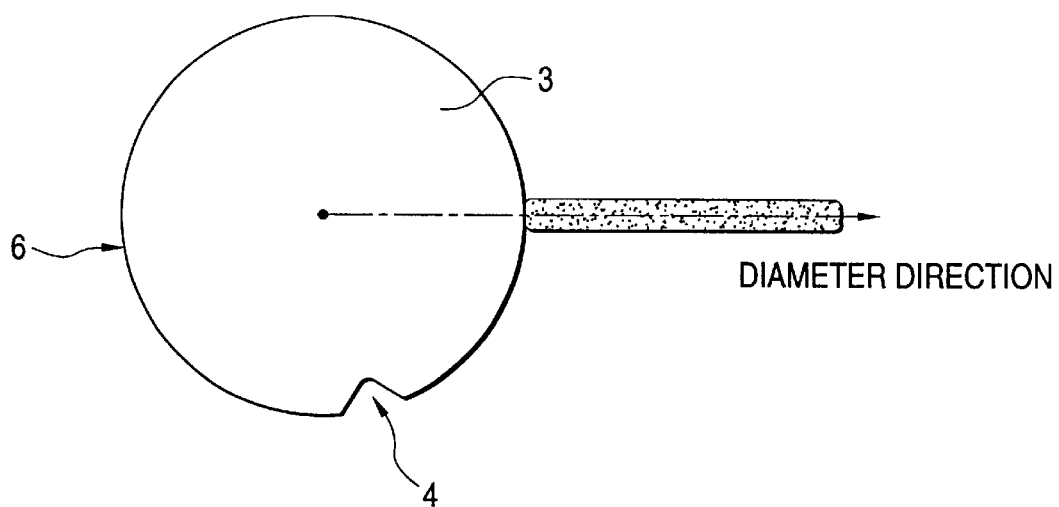
FIG. 6 is a schematic view of an embodiment of a circumferential portion grinding step employed in a wafer chamfering method according to the invention.
Figure 7:
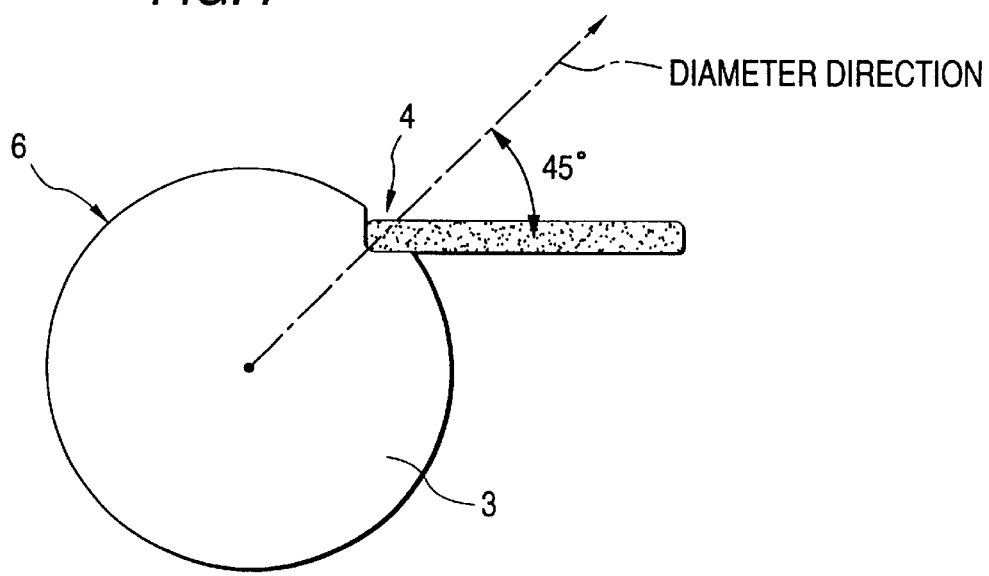
FIG. 7 is a schematic view of an embodiment of a notch portion grinding step employed in a wafer chamfering method according to the invention.
Figure 8:
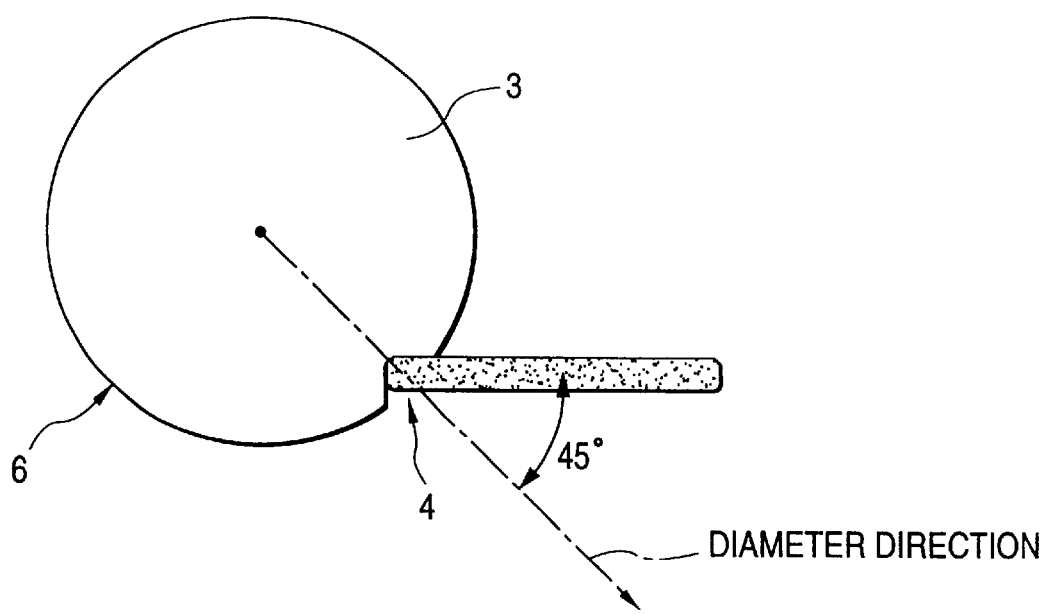
FIG. 8 is a schematic view of an embodiment of a notch portion grinding step employed in a wafer chamfering method according to the invention.

The circumstantial portion grinding step is an operation in which, as shown in FIGS. 1 and 6, the grindstone 8 is supported such that it stands upright or at right angles to the circumferential portion 6 of the wafer 3 (along the diameter direction thereof) at their respective mutual contact points, and only the flat portion 2 of the grindstone 8 is contacted with the circumferential portion 6 of the wafer 3 to thereby chamfer the circumferential portion 6 of the wafer 3.

On the other hand, the notch portion grinding step is an operation in which, as shown in FIGS. 2 to 3 or 7 to 8, the grindstone is supported such that it is inclined with respect to the diameter direction of the notch portion 4 of the wafer 3 by an angle of about 45° in the circumferential direction of the wafer 3, and the edge portions 5 and flat portion 2 are used to chamfer the notch portion 4 of the wafer 3. Referring here to the attitude of the grindstone when it is used to grind the wafer, generally, the grindstone is supported in such a manner that it stands upright or at right angles to the circumferential portion of the wafer at their respective mutual contact points. However, the attitude of the grindstone is not limited to such attitude but, for example, the grindstone can also be supported in such a manner that the rotational axis of the grindstone is parallel to the rotational axis of the wafer. By the way, the grindstone can also be used to grind one of the end faces of the wafer continuously.

Figure 2:
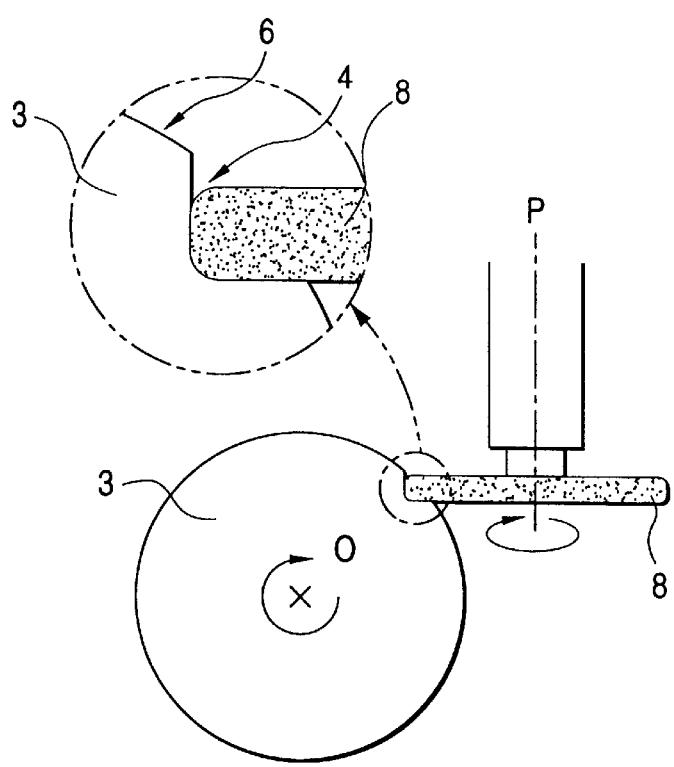
FIG. 2 is an explanatory view of an embodiment of a notch portion grinding step employed in a wafer chamfering method according to the invention.

Note that, in other words, as shown in FIGS. 2 and 3, in the warder chamfering method according to the present invention, a notch portion on the disk-shaped wafer is formed while rotating the grind wheel 8 under following conditions (iii) and (iv):

(iii) the aforementioned first plane is substantially extended perpendicular to the aforementioned second plane;

(iv) that the aforementioned second plane is inclined with respect to the aforementioned third plane by an predetermined angle (for example, about 45 degree).

When the circumstantial portion grinding step is carried out, the flat portion 2 of the grinding surface 1 of the grindstone 8 is worn or abraded in a curvedly recessed manner after the shape of the circumferential portion of the wafer 3 and, if the width of the flat portion 2 is excessively small, then the shapes of the edge portions 5 of the grinding surface 1 are also caused to change due to the abraded flat portion 2, which makes it impossible to make effective use of the grindstone 8. On the other hand, if the flat portion 2 is formed in a long shape, when using the flat portion 2, by moving the grindstone 9 slightly and reciprocatingly in the direction of the rotational axis P, the amount of abrasion of the flat portion 2 in a given portion can be reduced; and also, by moving the flat portion 2 sequentially while avoiding the abraded portion(s) thereof, there can be obtained a similar effect to the above.

Figure 9:
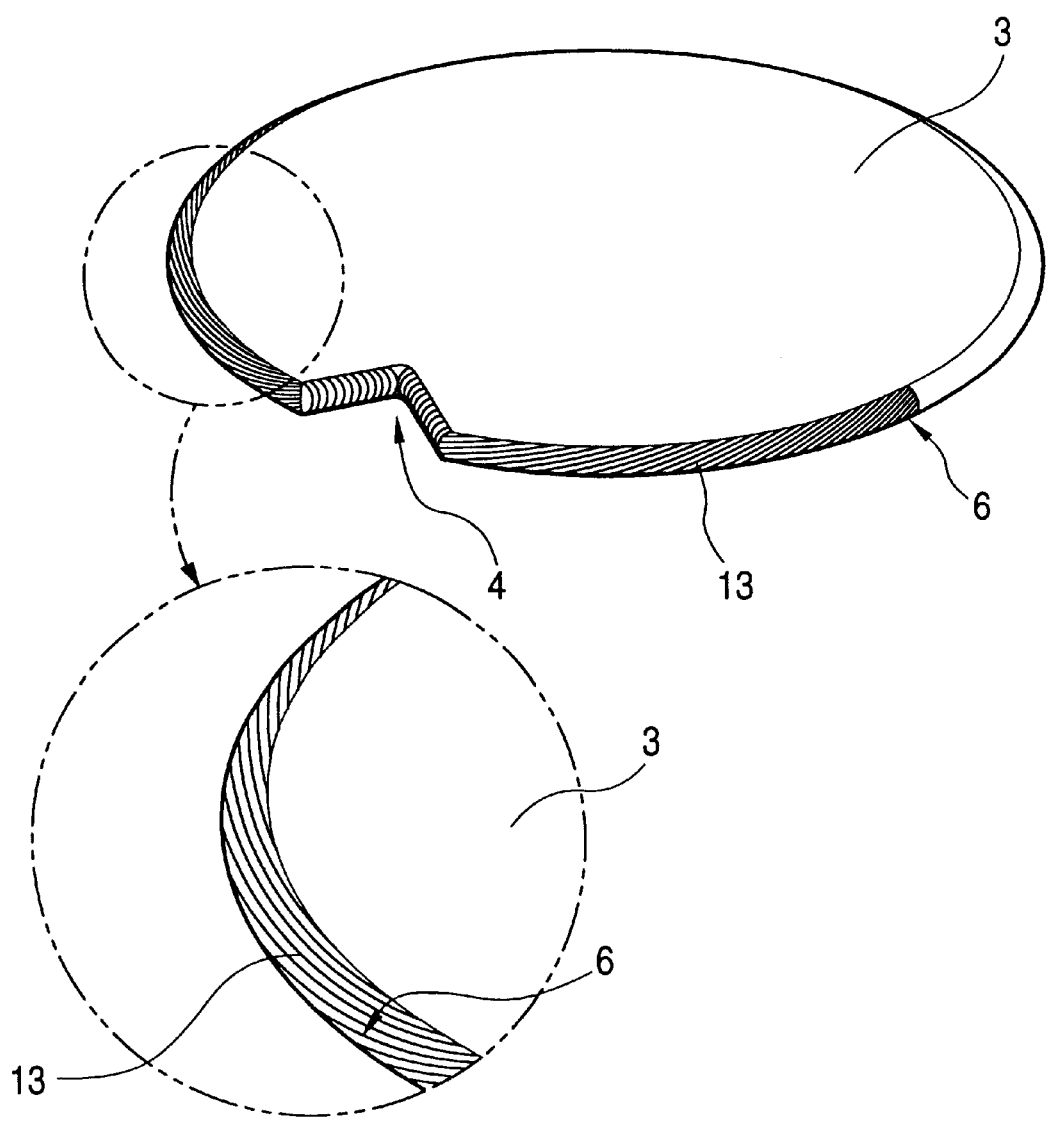
FIG. 9 is a perspective view of an embodiment of a wafer after chamfered and an enlarged view of the main portions thereof obtained in a wafer chamfering method according to the invention.
Figure 12:
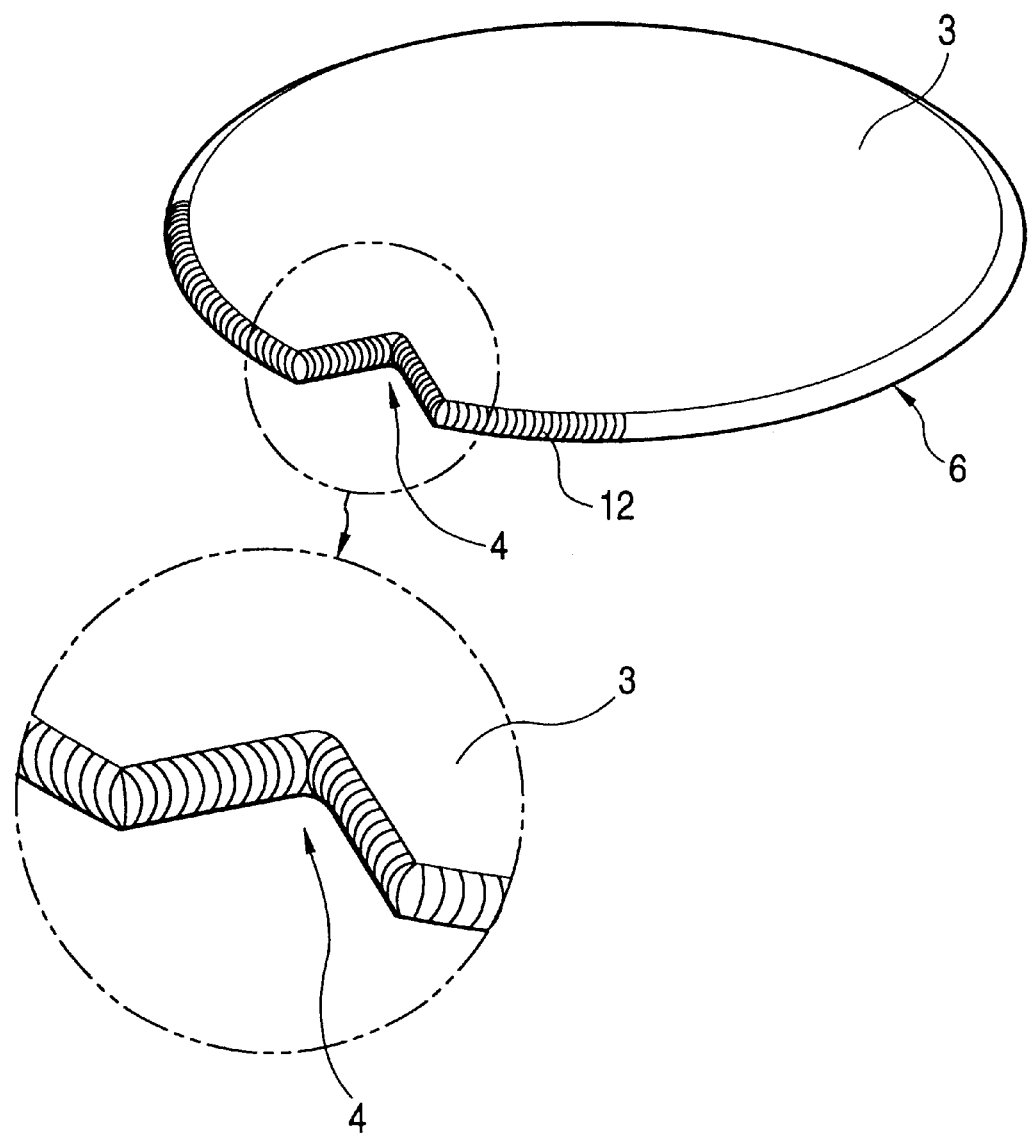
FIG. 12 is a perspective view of an embodiment of a wafer after chamfered and an enlarged view of the main portions thereof obtained in a wafer chamfering method according to the invention.
Figure 13:
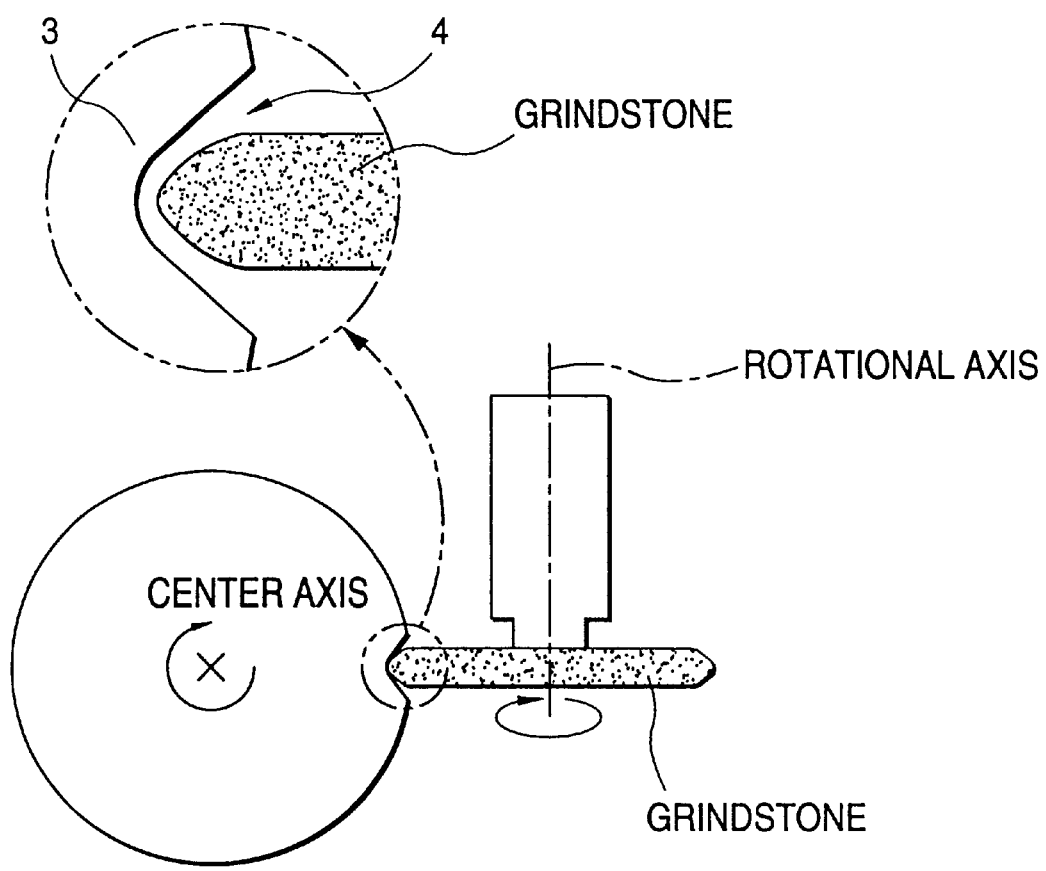
FIG. 13 is an explanatory view of an embodiment of a notch portion grinding step employed in a conventional wafer chamfering method.
Figure 14A:
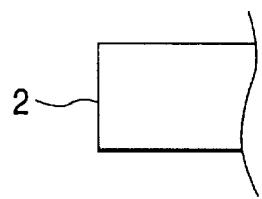
FIGS. 14A–D are sectional views of modifications of a grindstone including at least one flat portion.
Figure 14B:
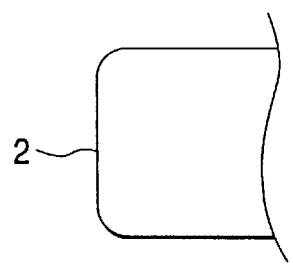
Figure 14C:
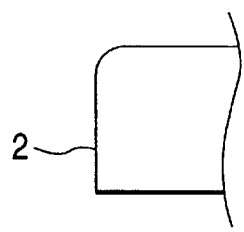
Figure 14D:
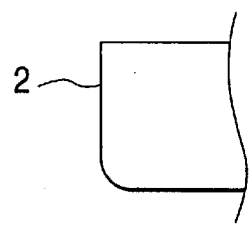

In the present circumferential portion grinding step, the wafer 3 is rotated in such a manner that the peripheral speed of the wafer 3 provides 100 m/min. or higher at least in a finishing step (for example, when the wafer 3 is ground in the order of a rough grinding operation, intermediate grinding operation, and a precision grinding operation, the finishing step corresponds to the precision grinding operation), and also the grindstone 8 is revolved while it is rotating. By grinding the wafer 3 under these chamfering conditions, in the circumferential portion 6 of the wafer 3, as shown in FIG. 12, there can be produced a grinding streak 12 which flows in the radial direction of the wafer 3 from the center thereof. Further, if the ratio of the peripheral speed of the grindstone 8 to the peripheral speed of the wafer 3 is set in the range of 0.001–10, then, in the circumferential portion 6 of the wafer 3, as shown in FIG. 9, there can be produced a grinding streak 13 which extends along the direction of a concentric circle of the wafer 3. That is, this makes it possible to prevent more effectively the damage of the wafer 3 such as a crack and the like from spreading up to the central portion of the wafer 3.

Figure 11:
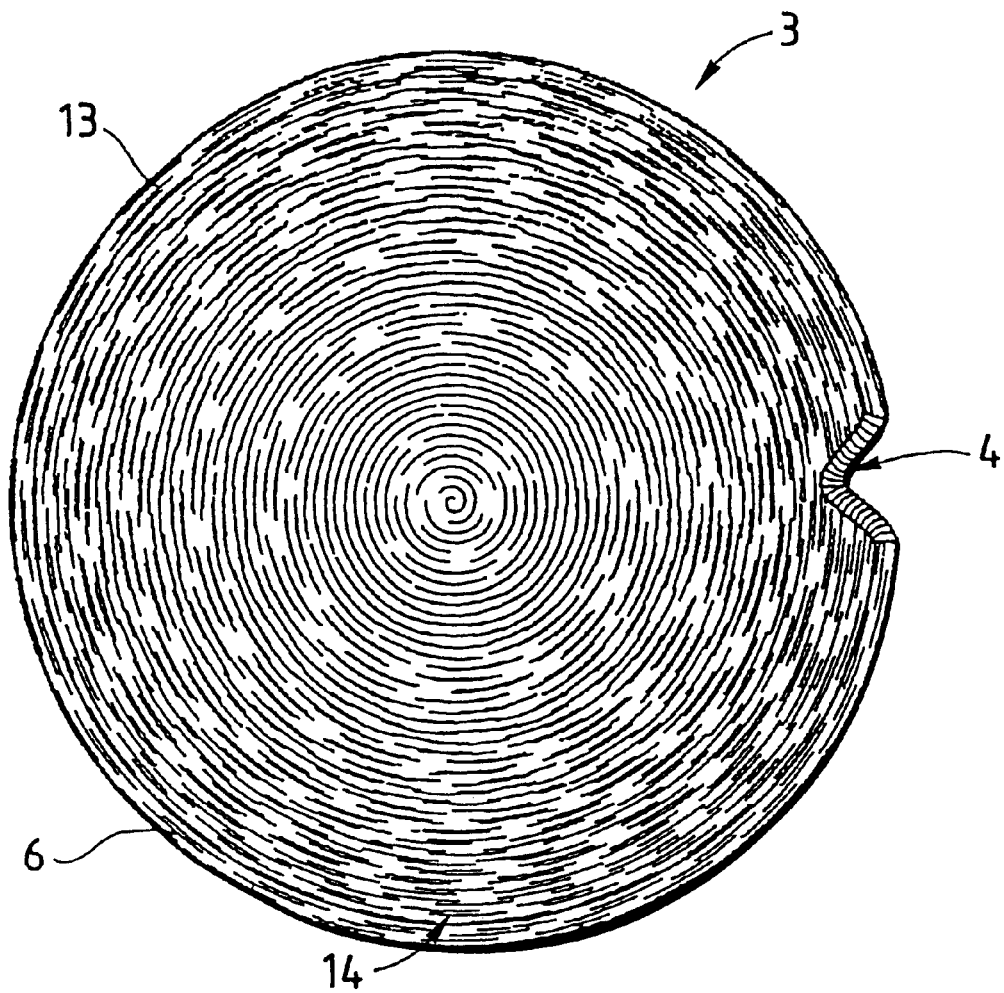
FIG. 11 is a plan view of an embodiment of a wafer after chamfered obtained in a wafer chamfering method according to the invention.

Here, the expression "the ratio of the peripheral speed of the grindstone 8 to the peripheral speed of the wafer 3" means the peripheral speed of the grindstone (that is, the moving speed of the peripheral edge of the grindstone produced by the rotation of the grindstone)/the peripheral speed of the wafer (the moving speed of the peripheral edge of the wafer produced by the rotation of the wafer). In particular, if the ratio of the peripheral speed of the grindstone 8 to the peripheral speed of the wafer 3 is less than 0.001, then the abrasive grains can be removed or abraded easily to thereby make it difficult to grind the wafer. That is, it is not desirable to select such low peripheral speed ratio. On the other hand, if the peripheral speed ratio is set in the range of 0.001–1, then the damage of the wafer 3 can be prevented further effectively. Further, as described above, if the grindstone 8 is moved linearly along the end face 14 of the wafer 3, as shown in FIG. 11, the grinding streak to be produced in the end face 11 of the wafer 3 can be made to extend along the direction of a concentric circle of the wafer 3, which can enhance the wafer damage preventive effect still further. By the way, the above setting of the peripheral speeds of the grindstone and wafer may be preferably employed at least in the finishing step (for example, when the wafer 3 is ground in the order of a rough grinding operation, intermediate grinding operation, and a precision grinding operation, the finishing step corresponds to the precision grinding operation). However, a timing of the chamfering operation in which a peripheral speed ratio setting should be employed may be selected properly according to the procedures of the actual chamfering operations.

The above-mentioned working or grinding condition that the peripheral speed of the wafer 3 is set higher than or equal to 100 m/min. can provide the following effects: that is, it can supplement/compensate the limited area of instantaneous contact between the grindstone 8 and wafer 3 in the grinding operation, can secure a sufficient contact area per unit time between them to be accumulated due to the rotation thereof, and can enhance the efficiency of the grinding operation. From the viewpoint of attaining the above effects, preferably, the peripheral speed of the wafer 3 may be set higher than or equal to 200 m/min., and, more preferably, it may be set higher than or equal to 300 m/min. By the way, the above-mentioned working condition that the rotation direction of the grindstone 8 is set in a single direction aims at eliminating as much as possible the factors that give rise to various grinding streaks in the wafer and, especially, it is desirable to employ this working condition in preventing the grinding streaks that could be otherwise produced due to the inverted rotation of the grindstone 8.

Also, as the notch portion grinding operation is repeated, the abrasion of the edge portion 5 also progresses; but, due to the abrasion of the flat portion 2 caused by the above-mentioned circumferential portion grinding step, there is formed a new edge portion following the edge portion 5 that has been abraded to disappear, although the new edge portion is different in curvature from the old edge portion 5: that is, such formation of the new edge portion makes it possible to extend the life of the grindstone 8.

The plane shape of the notch portion 4 that can be chamfered depends on the shape of the grinding surface 1 of the grindstone 8 and, in particular, the notch portion 4 having an angle larger than or equal to the angle that is formed by the peripheral surface 10 and end face 11 of the grindstone 8 (which is hereinafter referred to as an edge angle) can be chamfered. Therefore, if the edge angle is set as an acute angle, the cut-away portion of the notch portion 4 can be reduced; but, from the viewpoint of prevention of the notch portion 4 of the wafer 3 against breakage, preferably, the edge angle may be rather set as an obtuse angle, while the obtuse edge angle is also advantageous in strength. However, if the edge angle is set as an excessively obtuse angle, then there can be lost the advantages of the shape of the notch portion 4 having a V-like shape, such as the efficient use of the limited area of the wafer 3, excellent positioning precision and the like. With the above facts taken into account, from the viewpoint of stable use of the area of the portion that provides the grinding surface 1 and thus from the viewpoint of stable use of the shape of the notch portion 4, most preferably, the edge angle may be set about 90°.

Figure 5B:
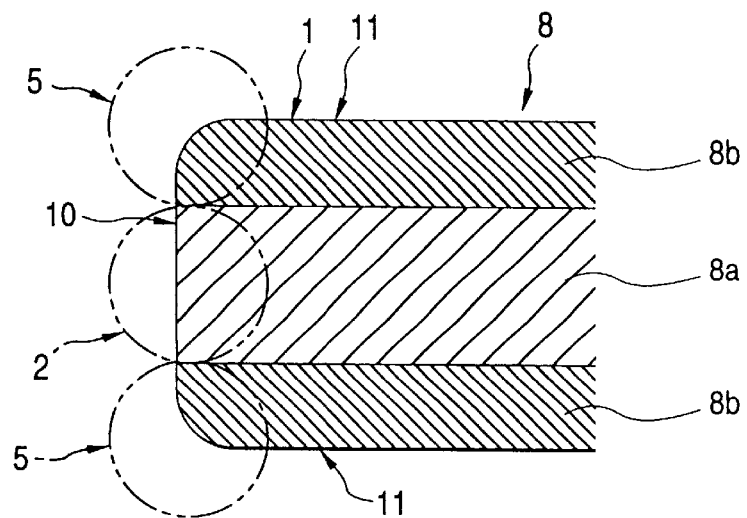
FIG. 5B is an enlarged view of a modified embodiment of a grindstone employed in FIG. 5A.
Figure 15A:
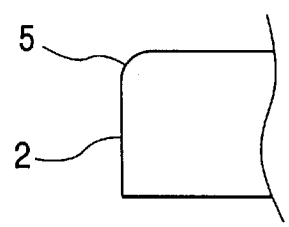
FIGS. 15A–C are sectional views of modifications of a grindstone including at least one edge portion.
Figure 15B:
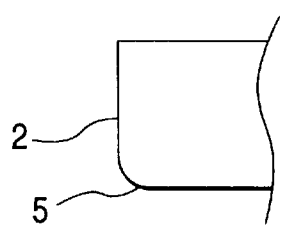
Figure 15C:
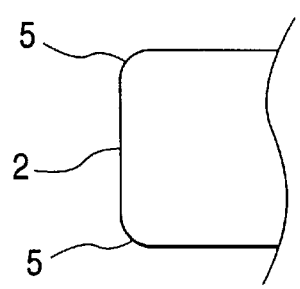

By the way, the above-mentioned embodiments are not limitative but, according to the invention, other embodiments are also possible. For example, an embodiment in which, in the circumferential portion grinding step thereof, a grindstone including at least a flat portion 2 formed in the width direction of the grinding surface 1 thereof is used as shown in FIGS. 14A, 14B, 14C and 14D; an embodiment in which, in the notch portion grinding step thereof, a grindstone including a flat portion 2 and at least one edge portion 5 is used as shown in FIGS. 15A, 15B and 15C; and, an embodiment in which, a grindstone including only the edge portion and a grindstone including only the flat portion are used in combination to chamfer the notch portion of the wafer as shown in FIG. 5B. That is, as shown in FIG. 5B, it is possible to form a disk-shaped grindstone 8 which comprises first and second disk-shaped grindstone members 8a and 8b. The first disk-shaped grindstone member 8a has a flat portion 2 for chamfering the circumferential portion 6. The second disk-shaped grindstone member 8b is attached to the first disk-shaped grindstone member 8a and has an edge portion in the form of a shape mating with a part of the notch so as to form a valley part of the notch portion. However, it is also possible to form the first and second disk-shaped grindstone member are integrally formed. In the last-mentioned embodiment, when compared with the embodiment in which the grindstone is used to chamfer the cylindrical portion of the wafer and also to chamfer the notch portion thereof, the grindstones can be effectively prevented from losing their shapes which are made in the form of the edge portion of the wafer to be chamfered.

The present invention is based on Japanese Patent Application No. Hei. 10-101267 and Hei. 11-50348, which is incorprated herein by reference.

While there has been described in connection with the preferred embodiment of the invention, it will be obvious to those skilled in the art that various changes and modifications may be made therein without departing from the invention, and it is aimed, therefore, to cover in the appended claim all such changes and modifications as fall within the true spirit and scope of the invention.

As described in an above-mentioned description, in a wafer chamfering method according to the invention, since the peripheral edge portion of the disk-shaped wafer is chamfered by the disk-shaped grinding wheel under predetermined conditions, the wafer chamfering method which can chamfer a surface of the wafer into an arbitrary shape and in the same shape all the time with excellent reproduction characteristics As has been described heretofore, in a wafer chamfering method according to the invention, since there is used the grindstone which includes a flat portion and edge portions, the amount of abrasion of the grinding surface of the grindstone can be decreased to a great extent to thereby reduce the amount of loss of the shape of the grindstone. Also, the shape of the grindstone and the arrangement of the grindstone with respect to the wafer can reduce the influences that could be otherwise caused by the shape-lost grindstone; and, therefore, not only the same grindstone can be used to grind the circumferential portion of the wafer as well as to chamber the tapered notch portion of the wafer to thereby carry out a series of chamfering operations without replacing the grindstone, but also the same grindstone can be used for a long period of time without dressing/re-shaping the grinding surface thereof. Further, since the above-mentioned manner of use of the grindstone eliminates the need to mold the grindstone in a thin shape, the grindstone can be used as a grindstone having a large diameter and, therefore, even if the grindstone is rotated at a low rotation speed, there can be obtained a high peripheral speed. In other words, when compared with a case in which a grindstone having a small diameter, according to the invention, a higher peripheral speed can be obtained when the grindstone is rotated at the same speed as the small-diameter grindstone, thereby being able to extend the life of the grindstone.

In addition, in a wafer chamfering method according to the invention, there can be provided an effect which is advantageous in cost. That is, the circumferential portion and notch portion of the wafer can be respectively chamfered in a mirror-like surface and also, when compared with the embodiment in which the grindstone is used to chamfer both of the circumferential portion and notch portion of the wafer, the amount of abrasion of the edge portion of the grindstone can be reduced, which in turn makes it possible to reduce the cost of the grindstone.

Further, in a wafer chamfering method according to the invention, there can be provided an outstanding effect: that is, the wafer can be chamfered in a mirror-like surface shape as well as in an arbitrary shape and in the same shape all the time by a grinding operation which is low in cost but high in efficiency.

Furthermore, in a wafer chamfering method according to the inventions, besides the above-mentioned effects of the invention, there can also be provided another outstanding effect: that is, the occurrence of the radially extending grinding streaks on the wafer can be prevented effectively and thus the damage of the wafer such as a crack or the like can be prevented effectively.

Moreover, in a wafer chamfering method according to the invention, besides the above-mentioned effects of the invention, there can also be provided still another outstanding effect: that is, the peripheral edge portion and end face of the wafer can be ground at a time in a mirror-surface shape.

What is claimed is:

1. A wafer processing method comprising:
    chamfering substantially the entire peripheral edge portion of a disk-shaped wafer while rotating said disk-shaped wafer and while rotating a disk-shaped grinding wheel and revolving said disk-shaped grinding wheel around said peripheral edge portion of said disk-shaped wafer in an orbit from a top side of said wafer to a bottom side of said wafer under conditions that a first plane substantially containing said disk-shaped wafer is substantially extended perpendicular to a second plane substantially containing said disk-shaped grinding wheel and that said second plane is substantially contained in a third plane which is defined by containing a diameter of said wafer and substantially extending perpendicular to said first plane.

2. The wafer processing method according to claim 1, further comprising:
forming a notch portion on said disk-shaped wafer while rotating said grind wheel under conditions that said first plane is substantially extended perpendicular to said second plane and that said second plane intersects said third plane by an predetermined angle while remaining substantially extended perpendicular to said first plane.

3. The wafer processing method according to claim 2, in which said second plane intersects said third plane by an angle of about 45° while remaining substantially extended perpendicular to said first plane when said notch portion is formed.

4. The wafer processing method according to claim 1, in which said disk-shaped grinding wheel comprises:
a disk-shaped grindstone including a circumferential portion in which a flat portion for chamfering said peripheral edge portion of said wafer is formed in its central portion in said width direction.

5. The wafer processing method according to claim 4, in which said disk-shaped grindstone further including:
at least one of edge portions formed in adjacent to said flat portion in the width direction, each having a shape mating with a part of said notch portion so as to form a valley part of said notch portion.

6. The wafer processing method according to claim 5, in which said notch portion is simultaneously formed by said flat portion and said edge portions.

7. The wafer processing method according to claim 2, in which said disk-shaped grinding wheel comprises:
a first disk-shaped grindstone member having a flat portion for chamfering said peripheral edge portion of said wafer; and
a second disk-shaped grindstone member attached to said first disk-shaped grindstone member and having an edge portion in the form of a shape mating with a part of said notch so as to form a valley part of said notch portion.

8. The wafer processing method according to claim 7, in which said first and second disk-shaped grindstone member are integrally formed.

9. The wafer processing method according to claim 1, in which the peripheral speed of said wafer thus rotated is set higher than or equal to 100 m/mm.

10. The wafer processing method according to claim 2, in which the peripheral speed of said wafer thus rotated is set higher than or equal to 100 m/mm.

11. The wafer processing method according to claim 7, in which the peripheral speed of said wafer thus rotated is set higher than or equal to 100 m/mm.

12. The wafer processing method according to claim 1, in which a ratio of the peripheral speed of said grindstone to the peripheral speed of said wafer is set in the range of 0.001–10.

13. The wafer processing method according to claim 2, in which a ratio of the peripheral speed of said grindstone to the peripheral speed of said wafer is set in the range of 0.001–10.

14. The wafer processing method according to claim 7, in which a ratio of the peripheral speed of said grindstone to the peripheral speed of said wafer is set in the range of 0.001–10.

15. The wafer processing method according to claim 9, in which a ratio of the peripheral speed of said grindstone (8) to the peripheral speed of said wafer is set in the range of 0.001–1.

16. The wafer processing method according to claim 10, in which a ratio of the peripheral speed of said grindstone to the peripheral speed of said wafer is set in the range of 0.001–1.

17. The wafer processing method according to claim 11, in which a ratio of the peripheral speed of said grindstone to the peripheral speed of said wafer is set in the range of 0.001–1.

18. The wafer processing method according to claim 1, further comprising the steps of:
executing an operation for grinding one of end faces of said wafer continuously.

19. The wafer processing method according to claim 2, further comprising the steps of:
executing an operation for grinding one of end faces of said wafer continuously.

20. The wafer processing method according to claim 7, further comprising the steps of:
executing an operation for grinding one of end faces of said wafer continuously.

21. The wafer processing method according to claim 9, further comprising the steps of:
executing an operation for grinding one of end faces of said wafer continuously.

22. The wafer processing method according to claim 14, further comprising the steps of:
executing an operation for grinding one of end faces of said wafer continuously.

23. The wafer processing method according to claim 15, further comprising the steps of:
executing an operation for grinding one of end faces of said wafer continuously.

24. The wafer processing method according to claim 2, in which said disk-shaped grindstone including:
at least one edge portion formed at one end of the circumferential portion thereof in the width direction, each having a shape mating with a part of said notch portion so as to form a valley part of said notch portion.

25. A wafer processing method comprising of:
chamfering substantially the entire peripheral edge portion of a disk-shaped wafer while rotating said disk-shaped wafer and while rotating a disk-shaped grinding wheel and relatively moving said disk-shaped wafer and said disk-shaped grinding wheel so as to relatively revolve said disk-shaped grinding wheel in an orbit around said peripheral edge portion of said disk-shaped wafer from a top side of said wafer to a bottom side of said wafer under conditions that a first plane substantially containing said disk-shaped wafer is substantially extended perpendicular to a second plane substantially containing said disk-shaped grinding wheel and that said second plane is substantially contained in a third plane which is defined by containing a diameter of said wafer and substantially extending perpendicular to said first plane, and
forming a notch portion on said disk-shaped wafer while rotating said grind wheel under conditions that said first plane is substantially extended perpendicular to said second plane and that said second plane intersects said third plane by an predetermined angle while remaining substantially extended perpendicular to said first plane.

26. The wafer processing method according to claim 25, in which the peripheral speed of said wafer thus rotated is set higher than or equal to 100 m/min.

27. The wafer processing method according to claim 25, in which a ratio of the peripheral speed of said grindstone to the peripheral speed of said wafer is set in the range of 0.001–10.

28. A wafer processing method comprising:

chamfering substantially the entire peripheral edge portion of a disk-shaped wafer while rotating a disk-shaped grinding wheel and relatively moving said disk-shaped wafer and said disk-shaped grinding wheel so as to relatively revolve said disk-shaped grinding wheel in an orbit around said peripheral edge portion of said disk-shaped wafer from a top side of said wafer to a bottom side of said wafer under conditions that a first plane substantially containing said disk-shaped wafer is substantially extended perpendicular to a second plane substantially containing said disk-shaped grinding wheel and that said second plane is substantially contained in a third plane which is defined by containing a diameter of said wafer and substantially extending perpendicular to said first plane, wherein said disk-shaped grinding wheel comprises a disk-shaped grindstone including a circumferential portion in which a flat portion for chamfering said peripheral edge portion of said wafer is formed in its central portion in its width direction.

29. The wafer processing method according to claim 28, in which the peripheral speed of said wafer thus rotated is set higher than or equal to 100 m/min.

30. The wafer processing method according to claim 28, in which a ratio of the peripheral speed of said grindstone to the peripheral speed of said wafer is set in the range of 0.001–10.

31. A wafer chamfering method comprising:

chamfering substantially the entire peripheral edge portion of a disk-shaped wafer while rotating said disk-shaped wafer and while rotating a disk-shaped grinding wheel and relatively moving said disk-shaped wafer and said disk-shaped grinding wheel so as to relatively revolve said disk-shaped grinding wheel in an orbit around said peripheral edge portion of said disk-shaped wafer from a top side of said wafer to a bottom side of said wafer under conditions that a first plane substantially containing said disk-shaped wafer is substantially extended perpendicular to a second plane substantially containing said disk-shaped grinding wheel and that said second plane is substantially contained in a third plane which is defined by containing a diameter of said wafer and substantially extending perpendicular to said first plane, wherein the peripheral speed of said wafer thus rotated is set higher than or equal to 100 m/min.

* * * * *